(12) United States Patent
Seki

(10) Patent No.: US 7,006,935 B2
(45) Date of Patent: Feb. 28, 2006

(54) SYNCHRONOUS VECTOR MEASURING DEVICE

(75) Inventor: Kempei Seki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/873,177

(22) Filed: Jun. 23, 2004

(65) Prior Publication Data

US 2005/0151532 A1 Jul. 14, 2005

(30) Foreign Application Priority Data

Jan. 13, 2004 (JP) .............................. 2004-005917

(51) Int. Cl.
*G01R 25/00* (2006.01)
(52) U.S. Cl. ........................... 702/64; 702/57; 702/60; 702/65; 702/66; 702/194; 702/196
(58) Field of Classification Search ................. 702/57, 702/60, 64–66, 79, 194, 196, 198; 324/76.77, 324/76.88, 86, 141, 650, 658, 76.19, 76.22; 327/2, 3, 17, 18, 156; 331/23, 25
See application file for complete search history.

(56) References Cited

U.S. PATENT DOCUMENTS

| 3,723,718 | A | * | 3/1973 | Jaffe et al. ..................... 703/4 |
| 5,006,846 | A | * | 4/1991 | Granville et al. ...... 340/870.28 |
| 5,568,154 | A | * | 10/1996 | Cohen ......................... 342/443 |
| 6,173,236 | B1 | * | 1/2001 | Elmore et al. ................ 702/64 |
| 6,639,393 | B1 | * | 10/2003 | Tasker et al. ............ 324/76.19 |
| 6,690,175 | B1 | * | 2/2004 | Pinzon et al. ............... 324/525 |
| 2002/0097055 | A1 | * | 7/2002 | Pinzon et al. ............... 324/525 |
| 2003/0102907 | A1 | * | 6/2003 | Tasker et al. .................. 330/2 |
| 2003/0115008 | A1 | * | 6/2003 | Doi ........................... 702/117 |
| 2003/0178322 | A1 | * | 9/2003 | Iyengar et al. .............. 205/775 |

OTHER PUBLICATIONS

U.S. Appl. No. 10/782,960, filed Feb. 23, 2004, Kempei Seki.

* cited by examiner

*Primary Examiner*—Carol S. W. Tsai
(74) *Attorney, Agent, or Firm*—Sughrue Mion, PLLC

(57) ABSTRACT

A synchronous vector measuring device can measure an absolute phase angle of a synchronous vector excellent in continuous numerical stability at high speed and with high accuracy in a noisy electric power system. A voltage measuring part measures the voltage of the electric power system at a period equal to 1/4N (N being a positive integer) of one period of a reference wave. A voltage root-mean-square value calculation part calculates, at each voltage measuring timing, a voltage root-mean-square value at a specific timing from the voltages measured at past 4N timings including the specific timing. An absolute phase angle calculation part makes, at each voltage measuring timing, an inverse cosine of a value obtained by dividing the voltage measured at the specific timing by the product of the voltage root-mean-square value and the square root of 2, as the absolute phase angle of the synchronous vector at the specific timing.

4 Claims, 15 Drawing Sheets

SYNCHRONOUS VECTOR MEASURING DEVICE

BACKGROUND OF THE INVENTION

1. Field of the Invention

The present invention relates to a synchronous vector measuring device for measuring a synchronous vector of an electric power system.

2. Description of the Related Art

A synchronous vector measuring device for calculating the quantity of electricity from an electric power system at high speed and with high accuracy obtains a synchronous voltage vector or phasor V by using a voltage instantaneous value $V_k$ (k=from 1 to N) measured at N sampling timings per cycle or period based on the following expression (1). Here, note θ in the expression (1) below represents a sampling angle. Then, an absolute phase angle $θ_v$ of the synchronous vector is obtained from the following expression (2) (for example, see a non-patent document: "Network Centric Approach to Protection, Control and Monitoring for Power Systems", by K. Sekiguchi and five others, in The Institute of Electrical Engineers of Japan Transactions on Power and Energy, published by The Institute of Electrical Engineers of Japan, issued in September, 2003, Vol. 123, No. 9, pp. 1030–1039).

$$V = \frac{\sqrt{2}}{N}\left\{\sum_{k=1}^{N} V_k \cdot \sin(k\theta) + j\sum_{k=1}^{N} V_k \cdot \cos(k\theta)\right\} \quad (1)$$

$$\theta_v = \tan^{-1}\left\{\frac{\text{Im}(V)}{\text{Re}(V)}\right\} \quad (2)$$

However, such a known synchronous vector measuring device, in which the absolute phase angle $θ_v$ of the synchronous vector is obtained from the real part and the imaginary part of the voltage vector by the use of a tangent function, involves the following problem. That is, the absolute phase angle $θ_v$ changes from minus 180 degrees to zero degrees, and further from zero degrees to plus 180 degrees, and in addition, it discontinuously changes from plus 180 degrees to minus 180 degrees. For this reason, the continuity of the absolute phase angle $θ_v$ is lost, and the numerical stability thereof is bad.

In addition, there is another problem as stated below. That is, the voltage effective value or voltage root-mean-square value of the electric power system is obtained by averaging the voltage instantaneous values within one cycle, but when the frequency of an object to be measured is different from a reference frequency, the voltage root-mean-square value and the absolute phase angle of the object to be measured cannot be correctly measured. In particular, when an accident occurs in the electric power system, the frequency thereof varies greatly and hence the accuracy of measurements becomes worse, so the synchronous vector measured in such a situation cannot be used for urgently needed system protection control as it is.

Moreover, there is also a further problem that voltage waveform noise due to the superposition of harmonic components, a momentary drop in voltage, etc., influences the measurement result of the absolute phase angle.

SUMMARY OF THE INVENTION

Accordingly, an object of the present invention is to provide a synchronous vector measuring device which is capable of measuring the absolute phase angle of a synchronous vector excellent in continuous numerical stability at high speed and with high accuracy in an electric power system with a lot of noise or the like.

Bearing the above object in mind, a synchronous vector measuring device according to the present invention is constructed as follows. That is, a voltage measuring part measures the voltage of an electric power system in a period equal to ¼N (N being a positive integer) of one period of a reference wave. A voltage root-mean-square value calculation part calculates, at each of timings at which the voltage is measured, a voltage root-mean-square value at a specific timing from the voltages measured at past 4N timings including the specific timing. An absolute phase angle calculation part calculates an absolute phase angle of a synchronous vector at each of the timings according to the following expression (3).

$$\beta = \cos^{-1}\left\{\frac{V_{re}}{\sqrt{2}\,V}\right\} \quad (3)$$

where β is the absolute phase angle, $v_{re}$ is the voltage measured at the specific timing, and V is the voltage root-mean-square value calculated at the specific timing.

The synchronous vector measuring device according to the present invention can provide the following advantageous effects. That is, the absolute phase angle of the synchronous vector, which is obtained by using the cosine function, increases from zero degrees to plus 180 degrees, and is then inverted at that point and decreases therefrom up to zero degrees. Thus, the absolute phase angle of the synchronous vector is always a positive value, and changes continuously even at zero degrees and plus 180 degrees. As a result, there will be no discontinuous change in the absolute phase angle which would be caused in the prior art, and the amount or rate of change thereof is limited, too. Accordingly, the synchronous vector measuring device of the present invention is excellent in the numerical stability and continuity of the absolute phase angle of the synchronous vector.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described below in detail while referring to the accompanying drawings.

Embodiment 1

Figure 1:
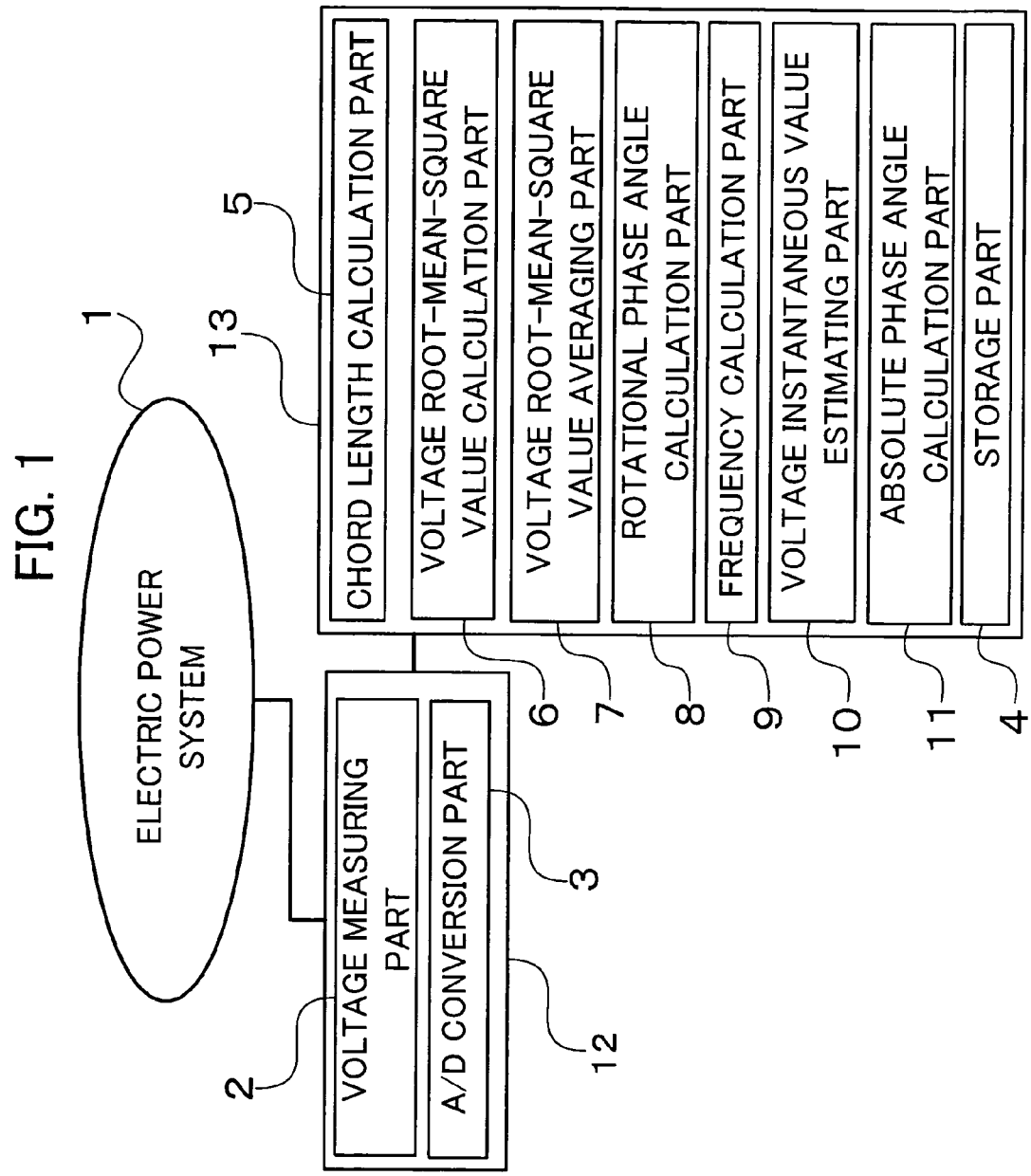
FIG. 1 is a block diagram of a synchronous vector measuring device according to a first embodiment of the present invention.
Figure 2:
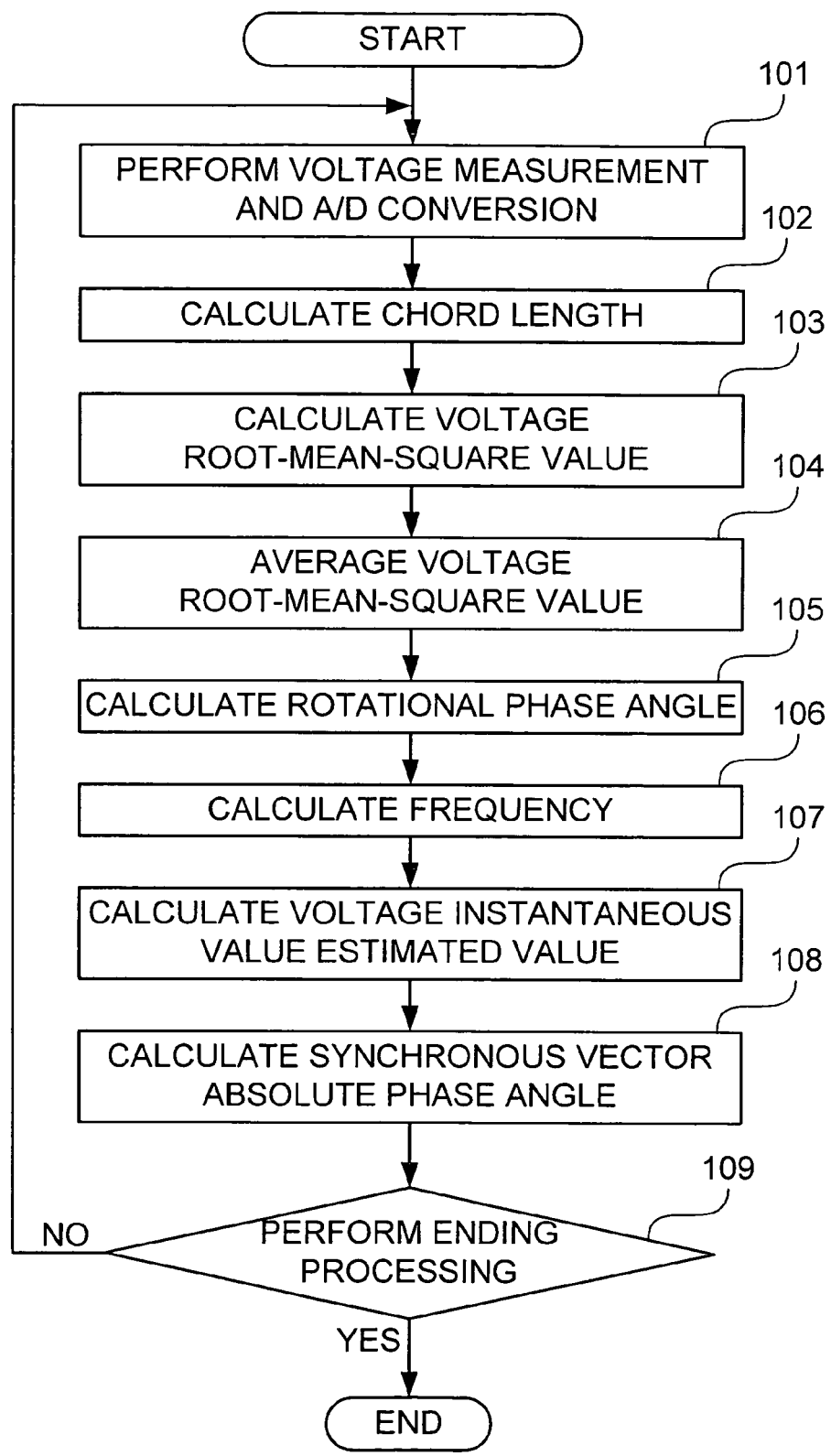
FIG. 2 is a flow chart of a synchronous vector measuring procedure used in the synchronous vector measuring device of FIG. 1.

FIG. 1 is a block diagram of a synchronous vector measuring device along with an electric power system according to a first embodiment of the present invention. FIG. 2 is a flow chart showing the operation of the synchronous vector measuring device of FIG. 1 for measuring a synchronous vector of the electric power system.

The synchronous vector measuring device of this embodiment includes a voltage measuring part 2 for measuring a voltage real number instantaneous value of an electric power system 1 at each prescribed timing, an A/D conversion part 3 for converting the voltage real number instantaneous value thus measured into a digital voltage real number instantaneous value, a storage part 4 for storing the digital voltage real number instantaneous value, a chord length calculation part 5 for calculating the length of a cord formed between tip ends of adjacent rotating voltage vectors at each prescribed timing, a voltage root-mean-square value calculation part 6 for calculating a voltage root-mean-square value from each voltage rotating vector, a voltage root-mean-square value averaging part 7 for averaging the voltage root-mean-square values thus calculated in a prescribed period, a rotational phase angle calculation part 8 for integrating the calculated cord length in a prescribed period of time to calculate a rotational phase angle, a frequency calculation part 9 for calculating the frequency of the electric power system 1 from the rotational phase angle thus calculated, a voltage instantaneous value estimating part 10 for calculating a voltage real number instantaneous estimated value from the digital voltage real number instantaneous value by using a least square method, and an absolute phase angle calculation part 11 for calculating the absolute phase angle of a synchronous vector.

The voltage measuring part 2 and the A/D conversion part 3 are constituted by a voltmeter 12 having a digital voltage output terminal. In addition, the storage part 4, the chord length calculation part 5, the voltage root-mean-square value calculation part 6, the voltage root-mean-square value averaging part 7, the rotational phase angle calculation part 8, the frequency calculation part 9, the voltage instantaneous value estimating part 10, and the absolute phase angle calculation part 11 are constituted by a computer 13. The computer 13 includes a CPU, a RAM, a ROM and an interface circuit.

Moreover, a plurality of synchronous vector measuring devices (not shown), which are similar to the one illustrated in FIG. 1, have their clocks synchronized with one another by using GPS.

Although in the following description, the frequency $f_0$ (Hz) of the reference wave being 50 Hz or 60 Hz is taken as an example, the reference wave is not limited to such frequencies. One period of the reference wave (second) is a reciprocal $1/f_0$ of the frequency $f_0$ thereof.

In addition, the point in time (hereinafter referred to as timing) at which the voltage real number instantaneous value of the electric power system 1 is measured is decided by determining the sampling cycle or period. The sampling period can be any value by which one period or cycle of the reference wave can be divided into 4N equal parts (N being a positive integer). As will be described later, since a voltage real number instantaneous value at a time point delayed by 90 electrical degrees from each sampling timing is used as the coordinate of the tip end of a voltage vector, a time point delayed by 90 degrees from each sampling timing should be one of the sampling timings. The one period of the reference wave is represented as $2\pi$ (radian) in terms of the electrical angle. For instance, an electrical angle of such as, for example, $\pi/6$, $\pi/12$, $\pi/24$, or $\pi/48$ of the reference wave is beforehand set as the sampling period.

Next, reference will be made to the procedure of measuring the synchronous vector of the power system 1 while referring to FIG. 2. In this explanation, it is assumed that the frequency $f_0$ of the reference wave is 50 Hz, and $\pi/6$, by which one period or cycle of the reference wave can be divided into 12 equal parts (N=3), is taken as a sampling period or cycle. A step size $\Delta t$ (second) becomes 0.00166667 seconds. k represents the order of voltage measurement timing, and becomes a value from 1 to 12 in one period of the reference wave. The electrical angle of the reference wave rotates by an angle of 30 degrees between voltage measurement timings k=1 and k=2.

Figure 3:
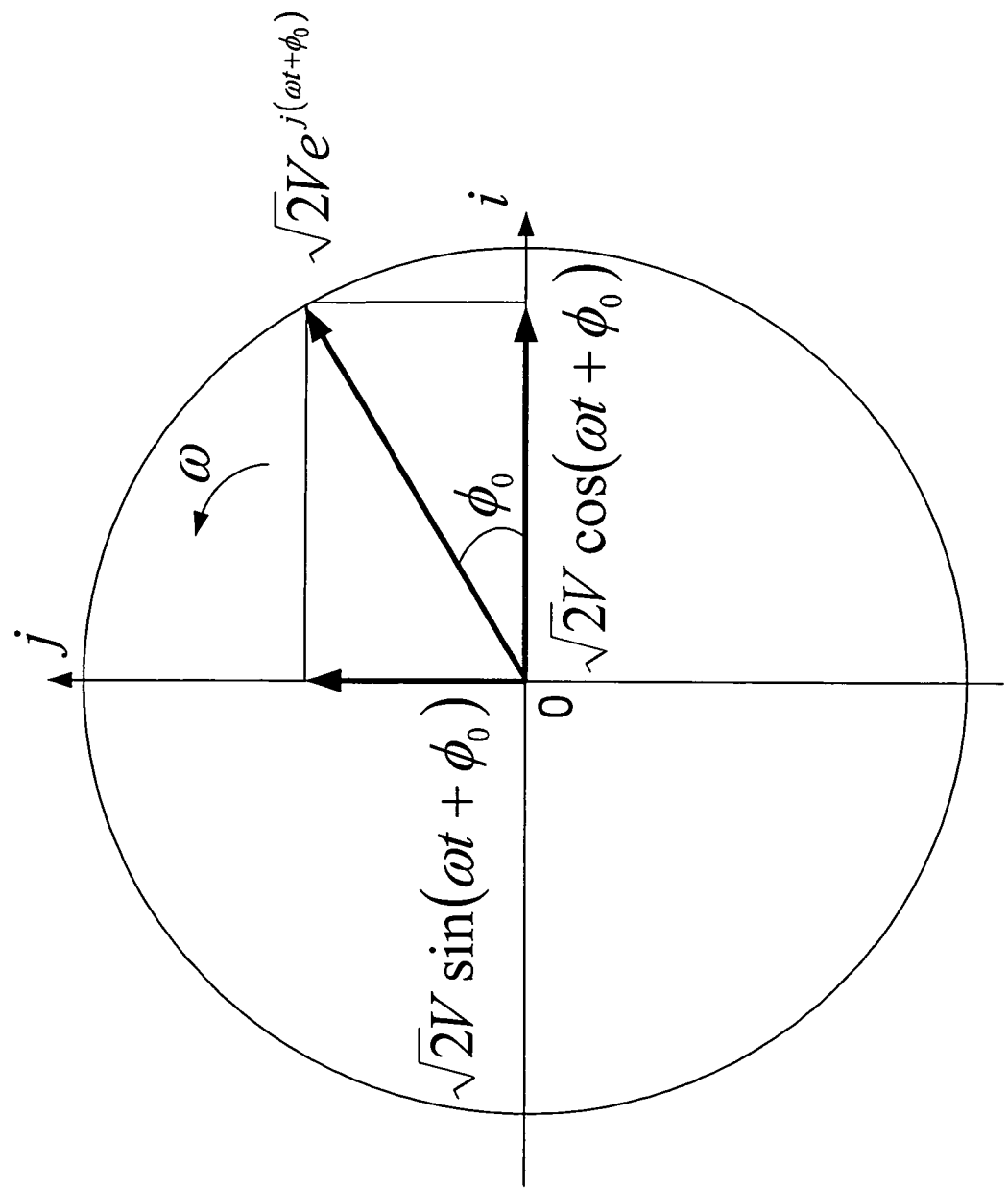
FIG. 3 is a view of a voltage rotating vector represented on a complex plane.

In step 101, the voltage measuring part 2 measures the voltage of the electric power system 1 to be measured upon each voltage measuring timing. An arbitrary or specific timing among the voltage measuring timings is represented by k. The last timing at which a measurement was made at the last time (i.e., the timing immediately before the specific timing) is represented by (k−1), and the timing following the specific timing is represented by (k+1). Thereafter, the A/D conversion part 3 converts the measured voltage in the form of an analog signal into a digital voltage signal, which is then stored in the storage part 4. When the voltage instantaneous value v(k) of the electric power system is expressed by a voltage vector rotating in a counterclockwise direction around the origin 0 on the complex plane, as shown in FIG. 3, this measured voltage is the voltage real number instantaneous value $v_{re}(k)$ as represented by expression (4) below. Here, note that V represents the voltage root-mean-square value (volts), ω represents the angular velocity (radian/second) of the voltage rotating vector, and $\phi_0$ represents a voltage initial rotational phase angle (radian). The angular velocity ω has a relation (ω=2πf) with respect to the frequency f of the electric power system to be measured.

$$v(k) = 2\sqrt{2}\, V e^{j(\omega t_k + \phi_0)} = \sqrt{2}\, V e^{j(\frac{\pi}{6}k + \phi_0)} \quad (4)$$
$$= v_{re}(k) + j v_{im}(k)$$
$$= \sqrt{2}\, V\cos(\frac{\pi}{6}k + \phi_0) + j\sqrt{2}\, V\sin(\frac{\pi}{6}k + \phi_0)$$

Figure 4:
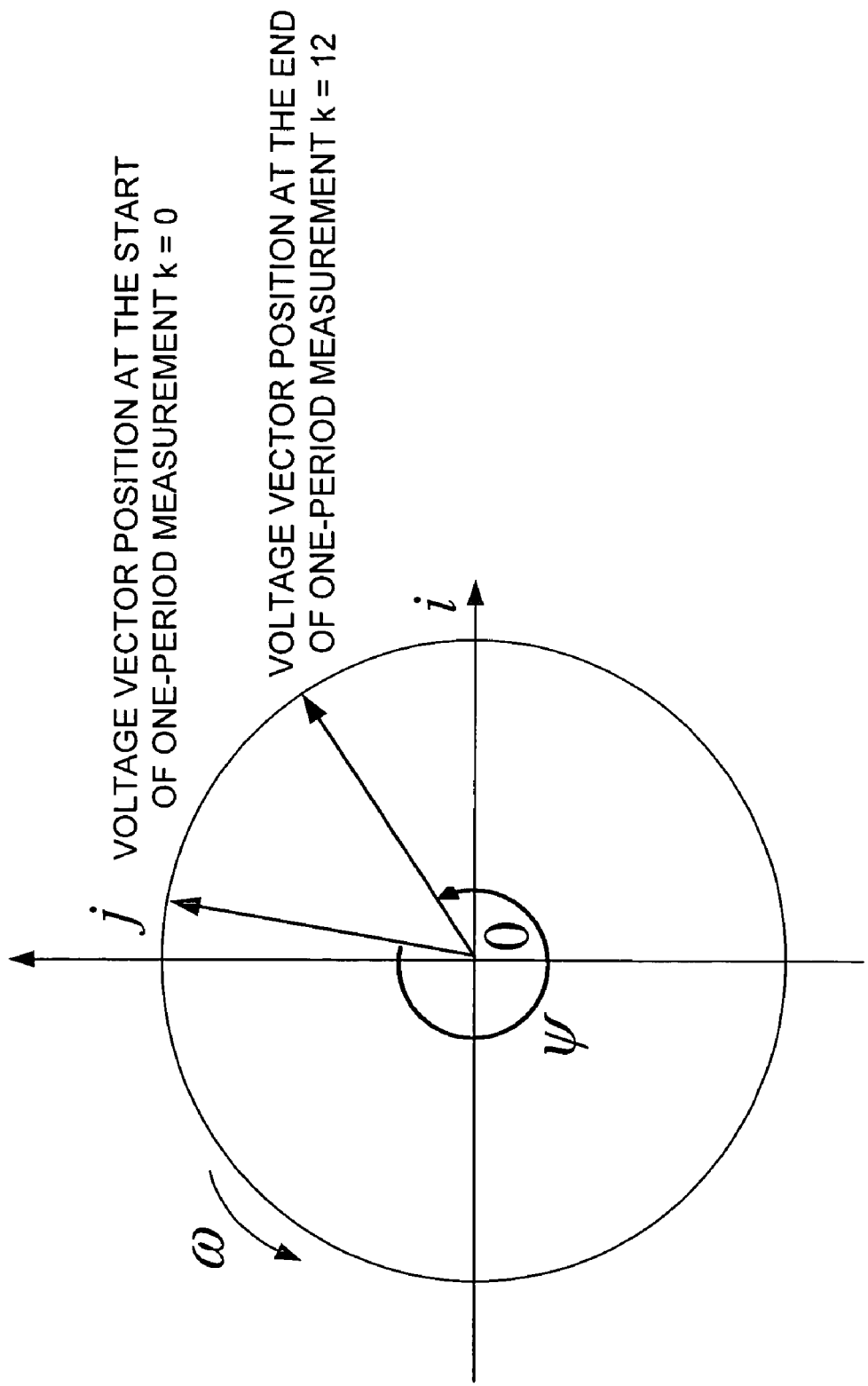
FIG. 4 is a view showing the voltage vector having rotated in one cycle or period of a reference wave in FIG. 3.
Figure 5:
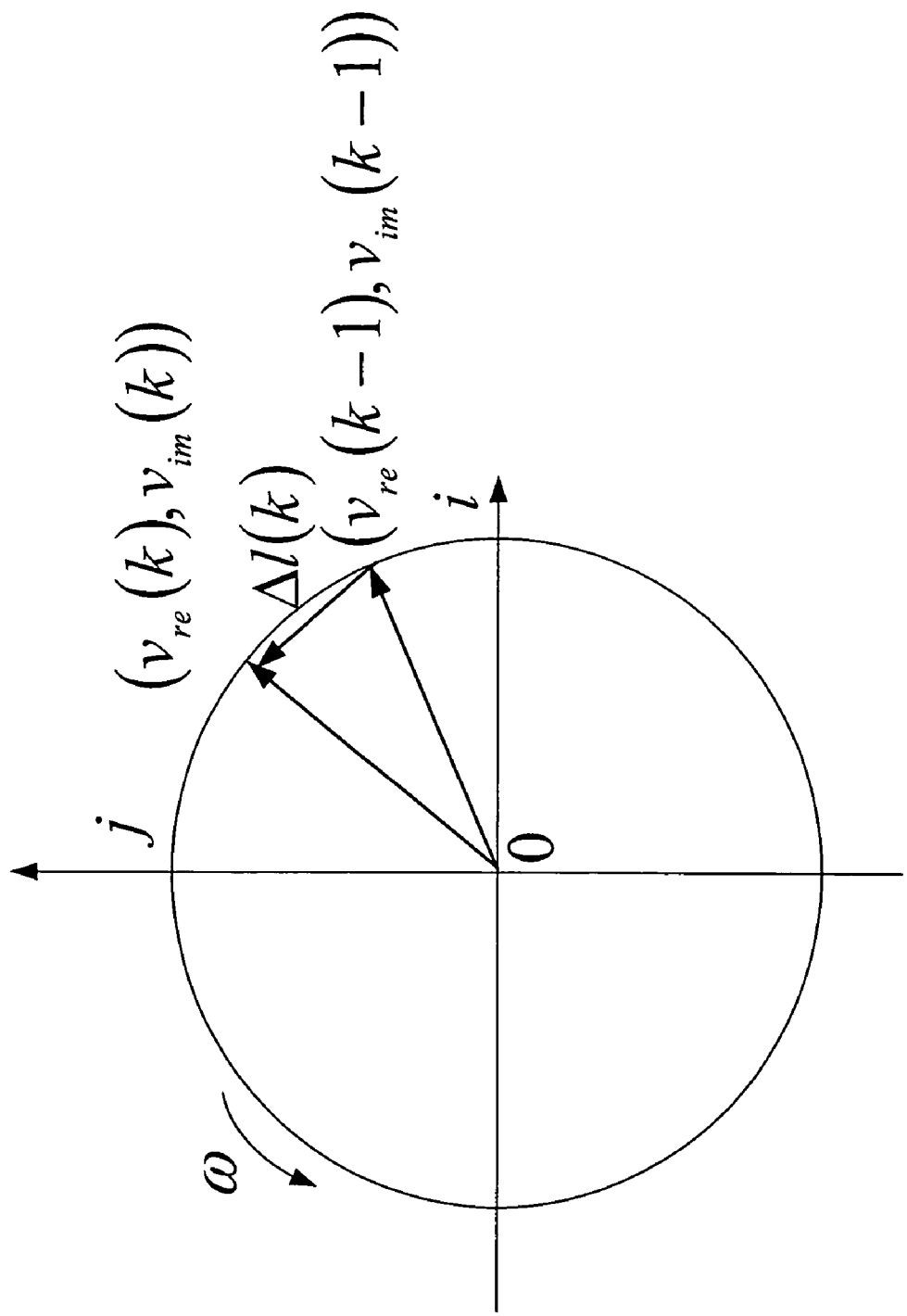
FIG. 5 is a view explaining the calculation of a chord length between two points at tip ends of voltage vectors.

In step 102, the chord length calculation part 5 calculates, at each of voltage measuring timings, a voltage rotating vector directed to a point represented by a complex number on a complex plane consisting of a real part which is a voltage measured at a first timing comprising any of the voltage measuring timings, and an imaginary part which is a voltage measured at a second timing delayed by 90 electrical degrees from the first timing. Then, the chord length calculation part 5 calculates, at each of the voltage measuring timings, the length of a cord connecting between a tip end of one voltage rotating vector calculated at each timing and a tip end of another voltage rotating vector calculated at the last timing before each timing. As shown in FIG. 4, the voltage rotating vector at a predetermined timing of the electric power system to be measured rotates counterclockwise by a phase angle Ψ (radian) on the complex plane in one period or cycle of the reference wave, i.e., from a time point of k=0 to a time point of k=12. Subsequently, as shown in expression (4) below, the voltage instantaneous value v(k) consists of a voltage real number instantaneous value $v_{re}(k)$ and a voltage imaginary number instantaneous value $v_{im}(k)$. This voltage imaginary number instantaneous value $v_{im}(k)$ is equal to the voltage real number instantaneous value $v_{re}(k-3)$, as shown in expression (5) below. This is a voltage measured at the timing of (k−3) when the sampling period is assumed to be π/6, but it corresponds to a voltage measured at the timing of (k−6) when the sampling period is assumed to be π/12 for example. Thus, the coordinates at the tip end of the voltage vector can be represented by the voltage real number instantaneous value $v_{re}(k)$ and the voltage imaginary number instantaneous value $v_{im}(k)$. The voltage imaginary number instantaneous value $v_{im}(k)$ is obtained by reading a corresponding voltage real number instantaneous value $v_{re}(k-3)$ from the storage part 4. Since the coordinates of the voltage rotating vectors at timings k and (k−1), respectively, can be obtained in this manner, the length Δl(k) of a cord connecting between the tip ends or points of the voltage rotating vectors shown in FIG. 5 can be obtained according to expression (6) below.

$$v_{im}(k) = \sqrt{2}\, V\sin(\frac{\pi}{6}k + \phi_0) \quad (5)$$
$$= \sqrt{2}\, V\cos(\frac{\pi}{6}k + \phi_0 - \frac{\pi}{2})$$
$$= v_{re}(k-3)$$

$$\Delta l(k) = \sqrt{\{v_{re}(k) - v_{re}(k-1)\}^2 + \{v_{im}(k) - v_{im}(k-1)\}^2} \quad (6)$$

In step 103, the voltage root-mean-square value calculation part 6 calculates, at each of the voltage measuring timings, a voltage root-mean-square value V(k) within one period of the reference wave from voltages measured at the past twelve timings from and inclusive of a specific timing according to expression (7) below using the voltage real number instantaneous value $v_{re}$.

$$V(k) = \sqrt{\frac{1}{12}\sum_{i=1}^{12} \{v_{re}(k-12+i)\}^2} \quad (7)$$

Figure 6:
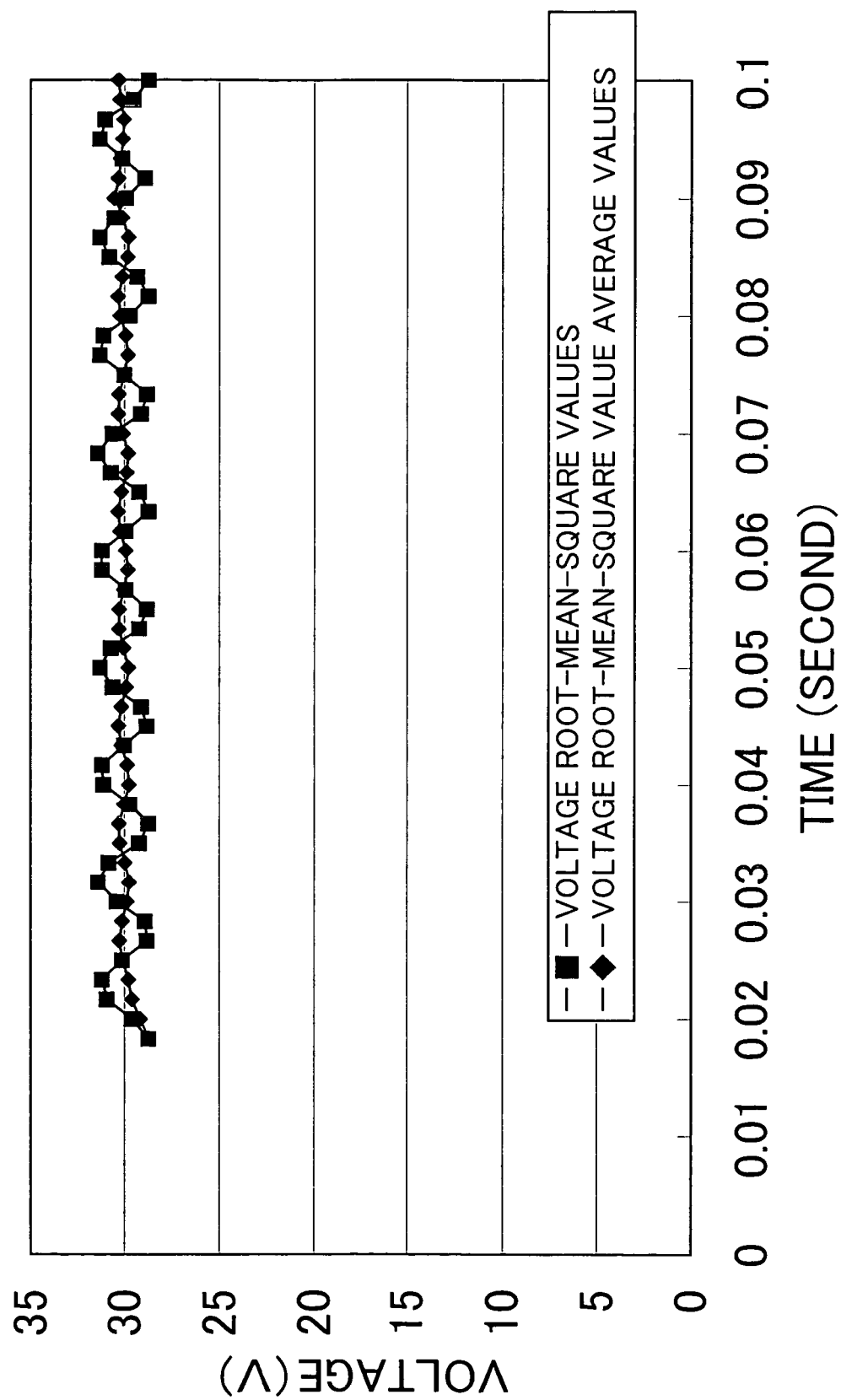
FIG. 6 shows the measurement result of the voltage root-mean-square values and their mean or averaged values of the electric power system having a frequency different from the frequency of the reference wave measured in FIG. 1.

In step 104, the voltage root-mean-square value averaging part 7 calculates, at each of the voltage measuring timings, an average value $V_{ave}(k)$ of voltage root-mean-square values V within one period of the reference wave based on a voltage root-mean-square value calculated at the specific timing and voltage root-mean-square values calculated at the past eleven timings preceding the specific timing according to expression (8) below. The mean value $V_{ave}(k)$ of the voltage root-mean-square values at the specific timing k is the mean value of the voltage root-mean-square values which have been obtained from the specific timing (k−11) to timing k, respectively. As shown in FIG. 6, when the frequency of the electric power system to be measured is different from the frequency of the reference wave, the voltage root-mean-square values oscillate around the actual voltage root-mean-square values. To remove the influence of such oscillation, the averaging process is performed.

$$V_{ave}(k) = \frac{1}{12}\sum_{i=1}^{12} V(k-12+i) \quad (8)$$

The accuracy in the voltage root-mean-square values thus processed improves according to the length of time of the averaging process. However, in order to shorten the measuring time, the averaging process is performed by using the voltage root-mean-square values obtained during one period of the reference wave, e.g., in twelve samplings in this case. By averaging the voltage root-mean-square values in this manner, the influence of the difference between the frequency of the electric power system to be measured and the frequency of the reference wave can be excluded, as shown in FIG. 6.

Figure 7:
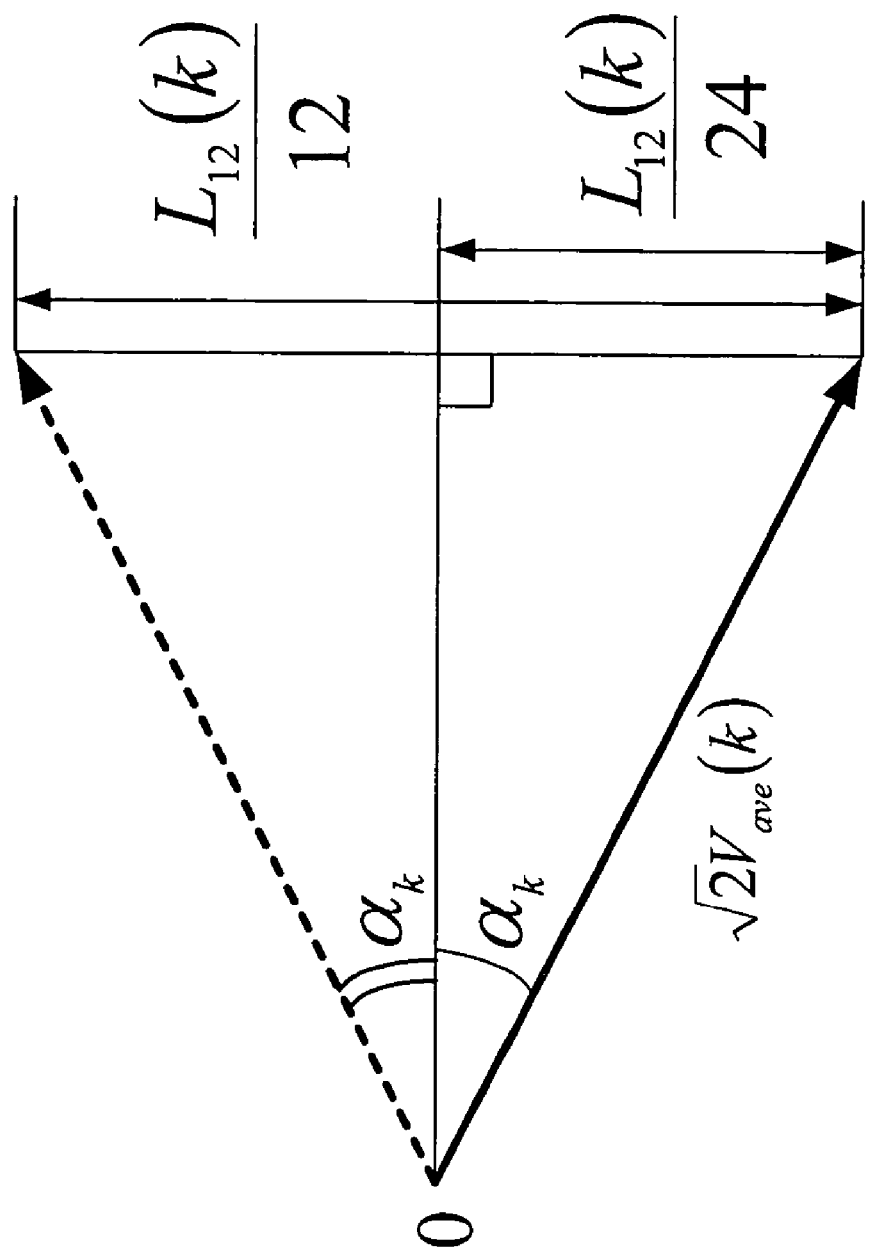
FIG. 7 is a view explaining the calculation of a phase angle facing a cord formed by two tip ends of voltage rotating vectors.
Figure 8:
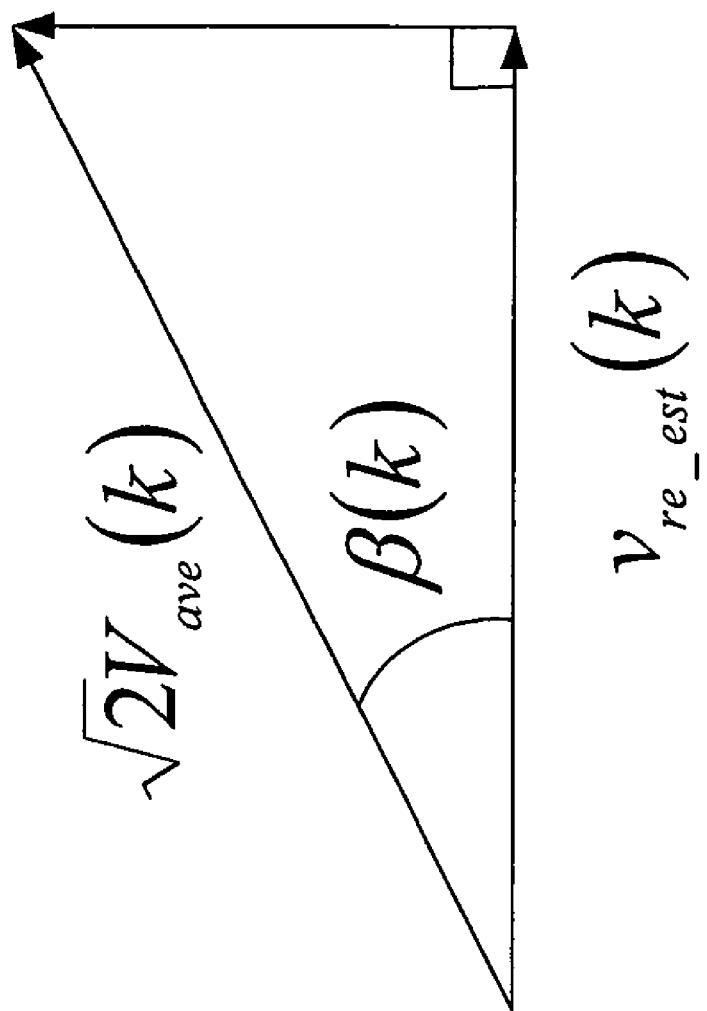
FIG. 8 shows a right-angled triangle indicating an absolute phase angle of a voltage rotating vector by a voltage root-mean-square value and an estimated value of a voltage real number instantaneous value.

In step 105, the rotational phase angle calculation part 8 calculates, at each of the voltage measuring timings, a total chord length $L_{12}(k)$ from the chord lengths calculated at the past twelve timings from and inclusive of the specific timing by using expression (9) below. Thereafter, the rotational phase angle calculation part 8 calculates, at each of the voltage measuring timings, a rotational phase angle $2\alpha_k$ between the specific timing k and the last timing (k−1) immediately before the specific timing according to expression (10) below, as shown in FIG. 7, and then it further calculates, at each of the voltage measuring timings, a phase angle Ψ(k) between a voltage rotating vector at the specific timing k and a voltage rotating vector at a preceding timing one period or cycle of the reference wave before the specific timing k, based on the rotational phase angle $2\alpha_k$ according to expression (11) below. The phase angle Ψ(k) is an electrical angle through which the voltage vector has rotated in one period of the reference wave.

$$L_{12}(k) = \sum_{i=1}^{12} \{\Delta l(k-12+i)\} \qquad (9)$$

$$= \sum_{i=1}^{12} \sqrt{\{v_{re}(k-12+i) - v_{re}(k-13+i)\}^2 + \{v_{im}(k-12+i) - v_{im}(k-13+i)\}^2}$$

$$\alpha_k = \sin^{-1}\left(\frac{\frac{L_{12}(k)}{24}}{\sqrt{2}\, V_{ave}(k)}\right) \qquad (10)$$

$$\psi(k) = 24 \times \alpha_k \qquad (11)$$

In step 106, the frequency calculation part 9 calculates, at each of the voltage measuring timings, the frequency f(k) of the electric power system to be measured from the phase angle of $2\pi$ of one period of the reference wave and the phase angle of Ψ(k) to be measured by using expression (12) below. Here, $f_0$ represents the frequency of the reference wave.

$$f(k) = \frac{f_0}{2\pi} \times \psi(k) \qquad (12)$$

In step 107, the voltage instantaneous value estimating part 10 calculates, at each of the voltage measuring timings, a voltage real number instantaneous estimated value at the specific timing from voltage real number instantaneous values $v_{re}$ measured at the past twelve timings from and inclusive of the specific timing by using the least square method. The voltage real number instantaneous value $v_{re}(t)$ can be expanded by the sine and the cosine of the product of the angular velocity and time, as shown in expression (13) below, and then can be rewritten with coefficients of the sine and the cosine being replaced with $P_1$ and $P_2$, respectively. Thereafter, by calculating coefficient estimated values $P_{1est}$ and $P_{2est}$ of these coefficients $P_1$ and $P_2$, the voltage real number instantaneous estimated value can be obtained. These coefficient estimated values $P_{1est}$ and $P_{2est}$ are estimated by the use of the least square method, and the angular velocity ω is obtained from the frequency f(k) of the electric power system to be measured.

The voltages measured at the past twelve timings from and inclusive of the specific timing k can be represented as a determinant (14) according to the expression (13) below. Also, a voltage real number instantaneous value matrix [v] and a trigonometric matrix [A] are represented by a determinant (15) and a determinant (16) below, respectively. In addition, a sampling timing time point matrix can be represented by a determinant (17) below. Δt represents a step (i.e., increment or decrement) in calculation, and it is 0.0016667s when one period or cycle of the reference wave is divided into 12 equal parts with the reference wave being 50 Hz, whereas it is 0.00138889s when one period or cycle of the reference wave is divided into 12 equal parts with the reference wave being 60 Hz. Moreover, an arbitrary coefficient matrix [P] can be represented by a determinant (18) below.

By representing the respective matrixes in this manner, the determinant (14) can be represented as a determinant (19) below, and an arbitrary coefficient matrix [P] can be obtained by a determinant (20) by using the least square method. Here, note that a transpose matrix $[A]^T$ is a determinant (21). The estimated values of this arbitrary coefficient matrix [P] are coefficient estimated values $P_{1est}$ and $P_{2est}$.

$$v_{re}(t) = \sqrt{2}\, V\cos(\omega t + \phi_0) \qquad (13)$$
$$= \sqrt{2}\, V\cos\phi_0 \cos\omega t - \sqrt{2}\, V\sin\phi_0 \sin\omega t$$
$$= P_1 \cos\omega t + P_2 \sin\omega t$$

$$\begin{bmatrix} v_{re}(k-11) \\ v_{re}(k-10) \\ \vdots \\ v_{re}(k) \end{bmatrix} = \begin{bmatrix} \cos\omega t_{k-11} & \sin\omega t_{k-11} \\ \cos\omega t_{k-10} & \sin\omega t_{k-10} \\ \vdots & \vdots \\ \cos\omega t_k & \sin\omega t_k \end{bmatrix} \cdot \begin{bmatrix} P_1 \\ P_2 \end{bmatrix} \qquad (14)$$

$$[v] = \begin{bmatrix} v_{re}(k-11) \\ v_{re}(k-10) \\ \vdots \\ v_{re}(k) \end{bmatrix} \qquad (15)$$

$$[A] = \begin{bmatrix} \cos\omega t_{k-11} & \sin\omega t_{k-11} \\ \cos\omega t_{k-10} & \sin\omega t_{k-10} \\ \vdots & \vdots \\ \cos\omega t_k & \sin\omega t_k \end{bmatrix} \qquad (16)$$

$$\begin{bmatrix} t_{k-11} \\ t_{k-10} \\ \vdots \\ t_k \end{bmatrix} = \begin{bmatrix} t_k - 11 \cdot \Delta t \\ t_k - 10 \cdot \Delta t \\ \vdots \\ t_k \end{bmatrix} = \begin{bmatrix} t_k \\ t_k \\ \vdots \\ t_k \end{bmatrix} - \begin{bmatrix} 11 \cdot \Delta t \\ 10 \cdot \Delta t \\ 0 \end{bmatrix} \qquad (17)$$

$$[P] = \begin{bmatrix} P_1 \\ P_2 \end{bmatrix} \qquad (18)$$

$$[v] = [A] \cdot [P] \qquad (19)$$

$$[P] = ([A]^T[A])^{-1}[A]^T[v] \qquad (20)$$

$$[A]^T = \begin{bmatrix} \cos\omega t_{k-11} & \cos\omega t_{k-10} & \ldots & \cos\omega t_k \\ \sin\omega t_{k-11} & \sin\omega t_{k-10} & \ldots & \sin\omega t_k \end{bmatrix} \qquad (21)$$

Figure 9:
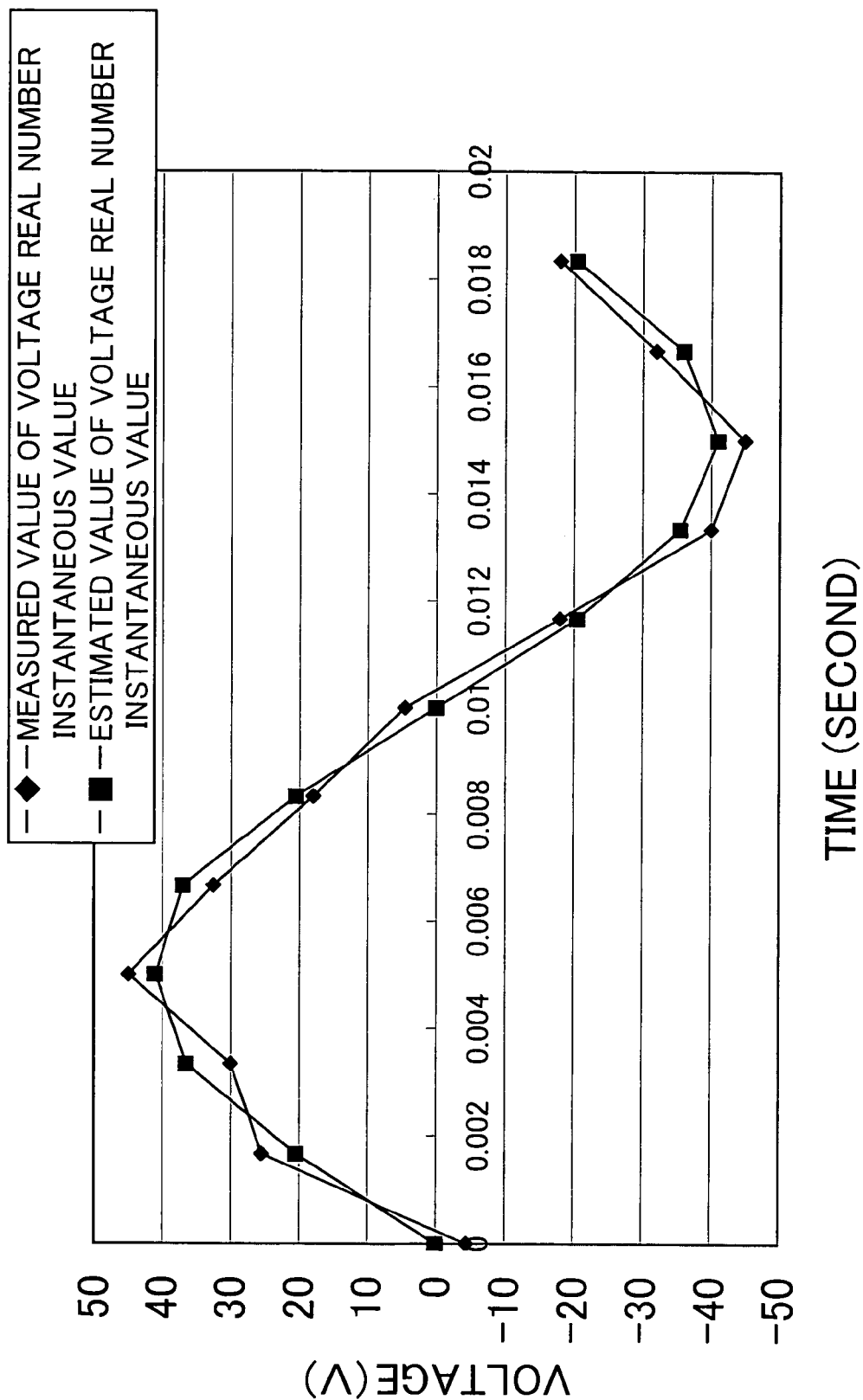
FIG. 9 shows the result of obtaining the estimated value of the voltage real number instantaneous value from a measured value of the voltage real number instantaneous value.

Since an arbitrary coefficient matrix [P] can be calculated in this manner, a voltage real number instantaneous estimated value $v_{re\_est}(k)$ can be obtained as expression (22) below. The voltage real number instantaneous estimated value estimated by using the measured value of the voltage real number instantaneous value and the least square method is shown in FIG. 9. As can be seen from FIG. 9, even if the voltage real number instantaneous value is varied due to voltage waveform noise, etc., it is estimated by using the least square method. Accordingly, the influence of voltage waveform noise does not reach this voltage real number instantaneous estimated value.

Then, in step 108, the absolute phase angle calculation part 11 calculates, at each of the voltage measuring timings, an absolute phase angle β(k) according to expression (23) below by using the voltage root-mean-square value average value obtained by the expression (8) above and the voltage real number instantaneous estimated value obtained by the expression (22). In this connection, note that the absolute phase angle may be calculated by using a voltage measured at each timing in place of the voltage real number instantaneous estimated value. Also, the absolute phase angle may be calculated by using the voltage root-mean-square value obtained by the expression (7) above in place of the voltage root-mean-square value average value.

$$v_{re\_est}(k) = P_{1est}\cos\omega t_k + P_{2est}\sin\omega t_k \quad (22)$$

$$\beta(k) = \cos^{-1}\left\{\frac{v_{re\_est}(k)}{\sqrt{2}\,V_{ave}(k)}\right\} \quad (23)$$

In step 109, it is determined whether the measurement of the absolute phase angle of the synchronous vector of the electric power system is to be ended. When the measurement is further continued, a return to the step 101 is performed.

Figure 10:
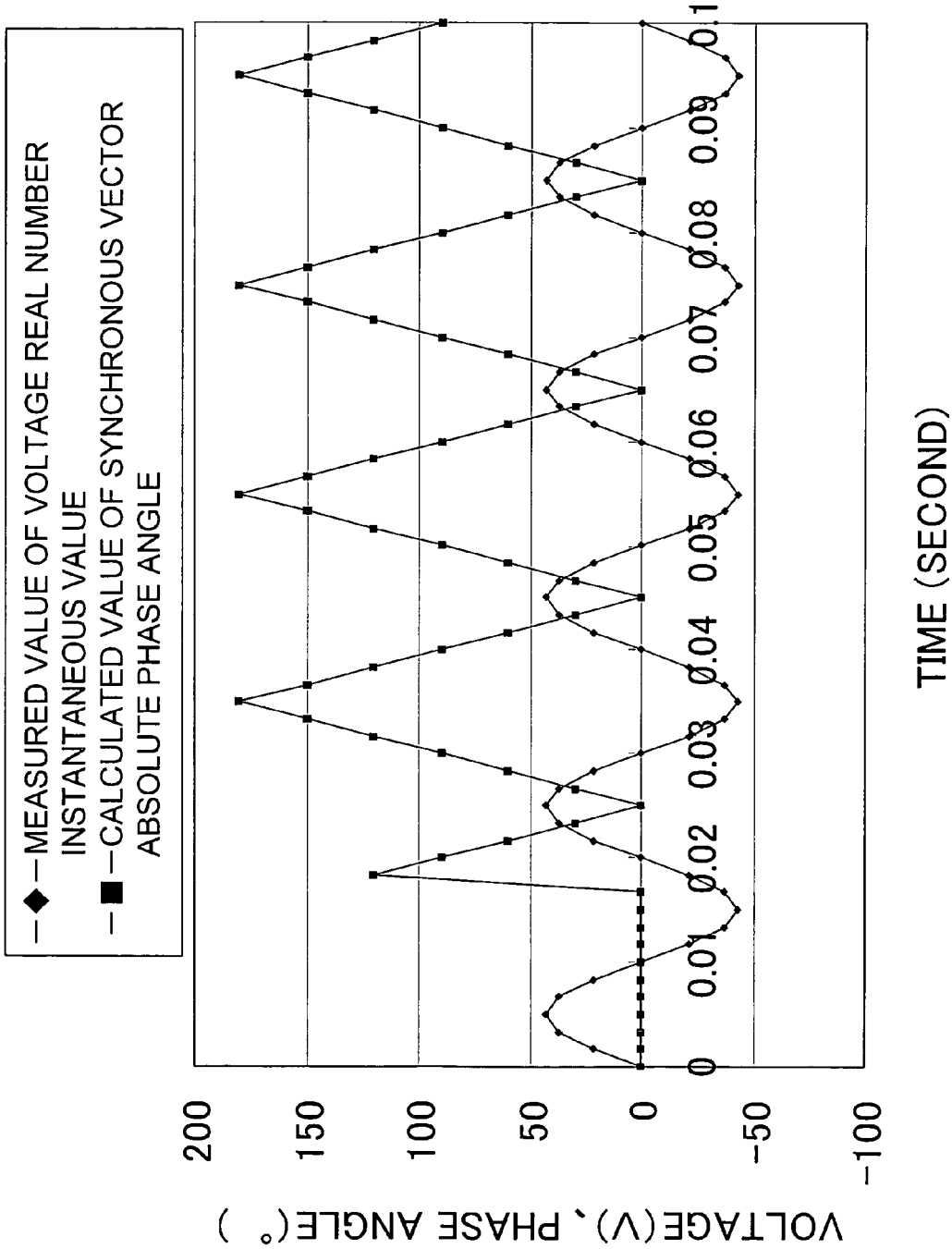
FIG. 10 shows the result of absolute phase angle measurements in an electric power system of a frequency of 50 Hz (the frequency of the reference wave being 50 Hz).
Figure 11:
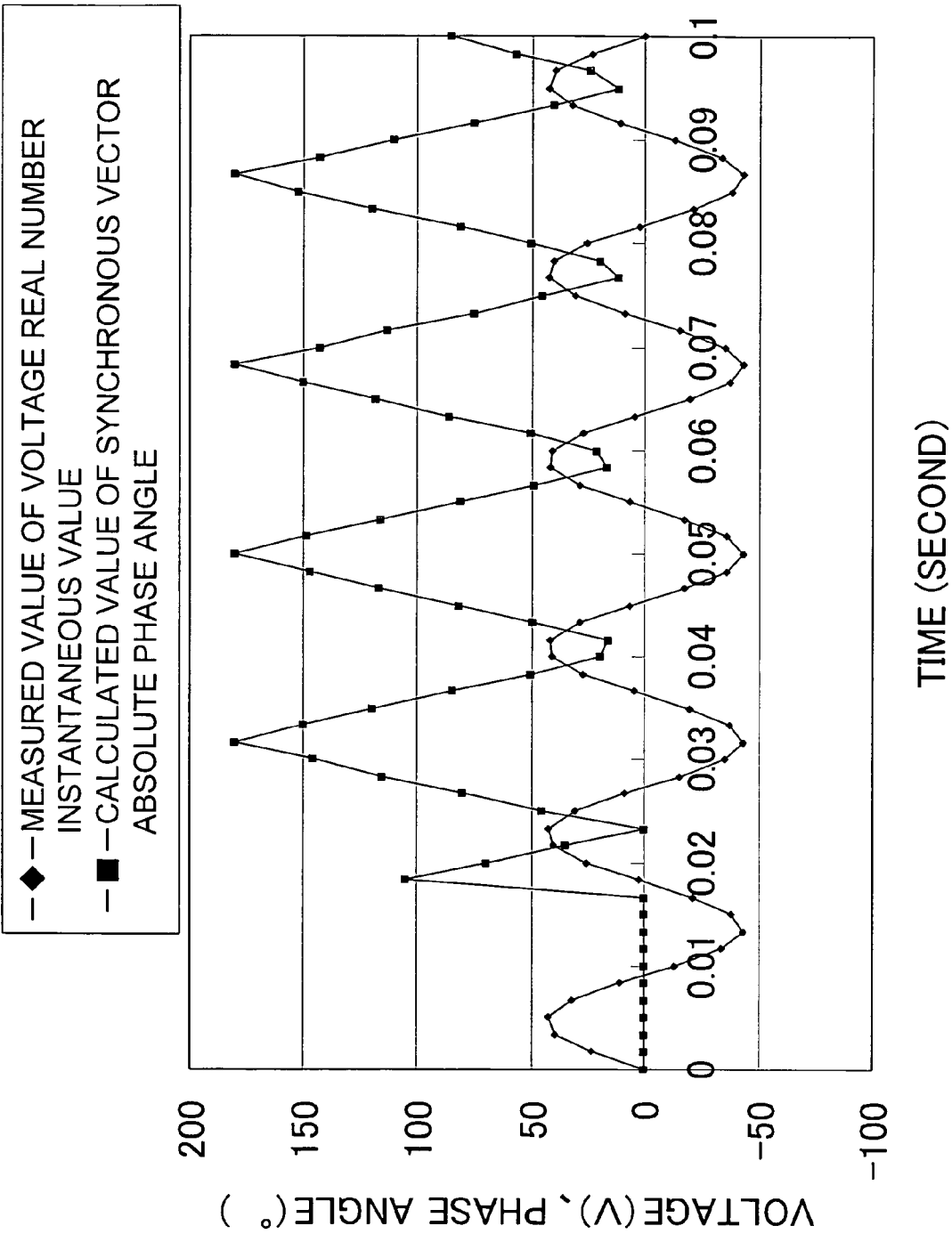
FIG. 11 is the result of absolute phase angle measurements of an electric power system of a frequency of 55 Hz (the frequency of the reference wave being 50 Hz).
Figure 12:
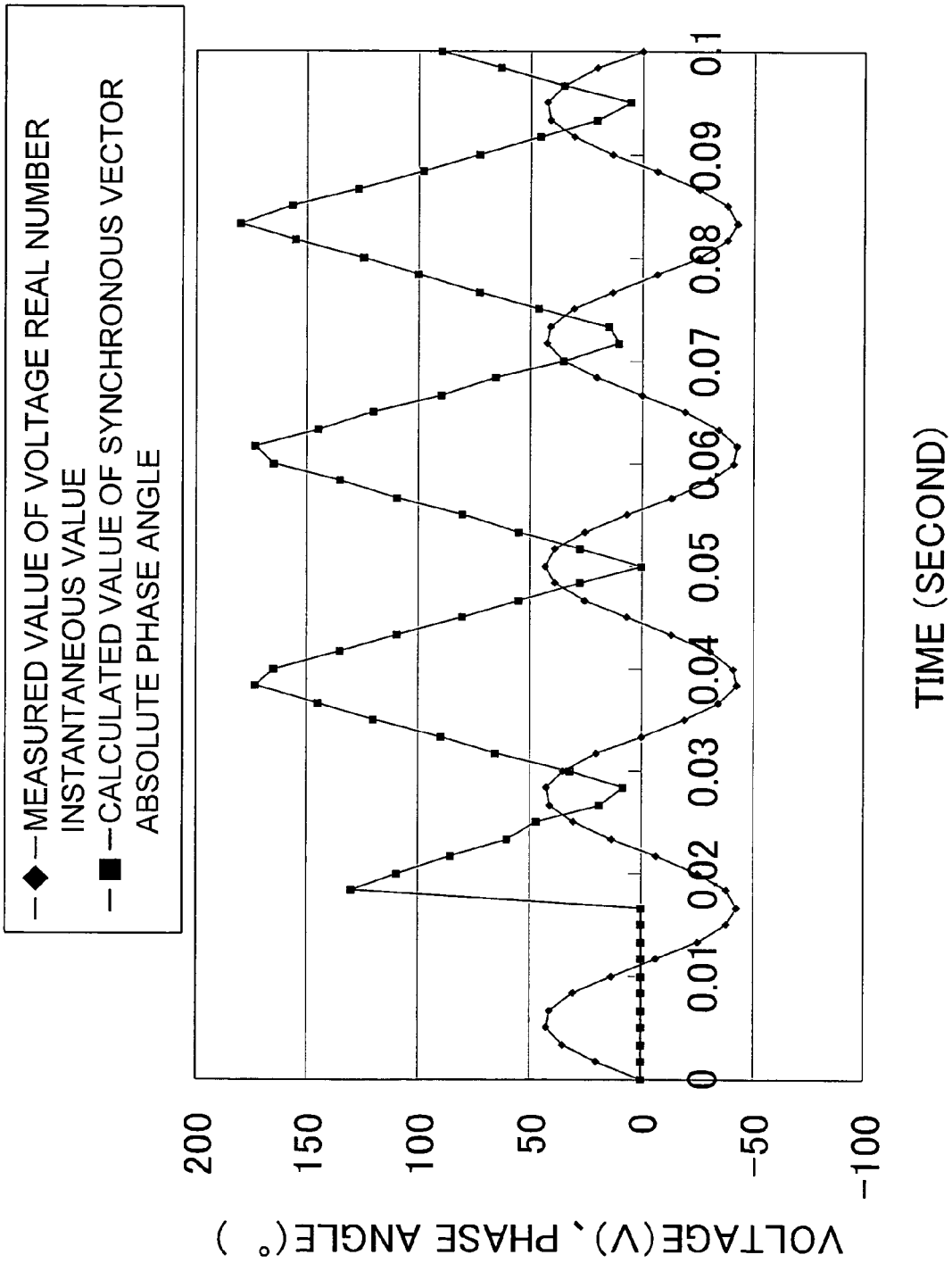
FIG. 12 is the result of absolute phase angle measurements of an electric power system of a frequency of 45 Hz (the frequency of the reference wave being 50 Hz).

Subsequently, on the condition that one period or cycle of the reference wave is divided into 12 equal parts with the frequency thereof being 50 Hz, the absolute phase angle of the synchronous vector is calculated when the frequency of the electric power system is 50 Hz, 55 Hz and 45 Hz, respectively. The results of 50 Hz, 55 Hz and 45 Hz are shown in FIG. 10, FIG. 11 and FIG. 12, respectively. As can be seen from these figures, it is possible to measure the absolute phase angle of the synchronous vector with a high degree of accuracy even when the frequency of the electric power system is varied. Although the actual frequency of an electric power system varies around a reference frequency, the frequency measuring device of the present invention can measure the stable frequency of the electric power system with high accuracy.

In addition, though the step size Δt for calculation is assumed to be a reference wave rotational electrical angle of 30 degrees, the smaller the calculation step size Δt upon actual measurement, the higher becomes the accuracy in the measurement.

In such a synchronous vector measuring device for an electric power system, the absolute phase angle of the synchronous vector, which is obtained by using the cosine function, increases from zero degrees to plus 180 degrees, and is then inverted at that point and decreases therefrom up to zero degrees. Thus, the absolute phase angle of the synchronous vector is always a positive value, and changes continuously even at zero degrees and plus 180 degrees. As a result, there will be no discontinuous change in the absolute phase angle which would be caused in the prior art, and the amount of change thereof is limited, too. Accordingly, the synchronous vector measuring device of the present invention is excellent in the numerical stability and continuity of the absolute phase angle of the synchronous vector.

Moreover, the voltage rotating vector is obtained by using the voltage measured in a period or cycle equal to ¼N of one period of the reference wave, and the frequency of the electric power system is obtained by a comparison between the rotational phase angle of the voltage rotating vector and the rotational phase angle of the reference wave, whereas the voltage real number instantaneous estimated value is estimated from the measured voltage real number instantaneous value. As a result, the synchronous vector of the electric power system can be measured in a short time, i.e., in one period of the electric power system.

Further, since the running average of the voltage root-mean-square value is obtained, an error in the voltage root-mean-square value becomes small, as a result of which a measurement error in the absolute phase angle of the synchronous vector obtained by using this voltage root-mean-square value is also reduced. Accordingly, if an accident takes place in the actual electric power system, the frequency thereof is caused to change greatly, but it is possible to suppress its influence to a minimum.

Furthermore, since the voltage real number instantaneous estimated value is estimated from the measured voltage by using the least square method, when the load of the electric power system is varied or when the voltage changes abruptly or steeply, it is possible to suppress resultant influences in an effective manner. Consequently, calculation errors in the absolute phase angle can be reduced.

It is to be note that the present invention, in which the voltage is represented by a voltage vector rotating on the complex plane, is different from the conventional alternating current theory in which the steady state of the voltage is represented by a stationary vector (phasor).

Embodiment 2

Figure 13:
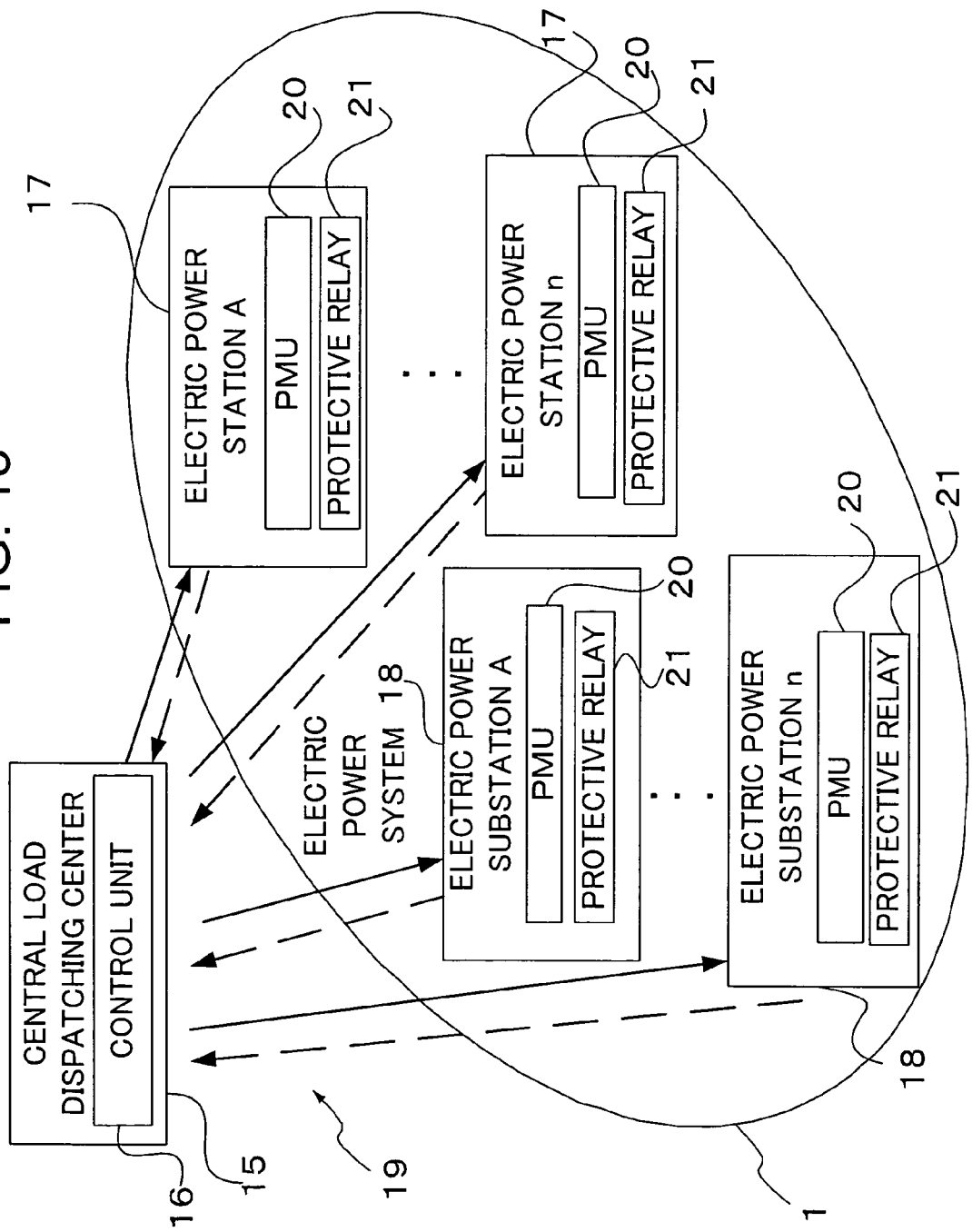
FIG. 13 is a block diagram of a power system stabilization control apparatus using a synchronous vector measuring device according to a second embodiment of the present invention.

FIG. 13 is a block diagram of a protection control system for an electric power system in which electric power stations and electric power substations are each provided with a synchronous vector measuring device according to a second embodiment of the present invention.

The protection control system for an electric power system includes a control unit 16 arranged at a central load dispatching center 15 for supervising and controlling the entire electric power system 1, a synchronous vector measuring device 20 provided at each of electric power stations 17 and electric power substations 18 arranged in respective places of the electric power system 1 for measuring the synchronous vector of the electric power system and sending the measured value of the synchronous vector to the control unit 16 through a network 19, and a protective relay 21 provided at each of the electric power stations 17 and the electric power substations 18 for protecting and controlling the electric power system 1. Here, note that each of the synchronous vector measuring devices 20 is similar to that of the first embodiment, and hence an explanation thereof is omitted. In addition, the respective synchronous vector measuring devices 20 are synchronized with one another by using GPS.

Information comprising the absolute phase angle and the frequency of the synchronous vector measured at each of the electric power stations 17 and the electric power substations 18 is sent, in a prescribed period or cycle (for example, 20 ms or less in the case of one cycle being 50 Hz), from each of the electric power substations 18 and the electric power stations 17 to the control unit 16 through the network 19. The control unit 16 comprehensively determines differences between the absolute phase angles and the variation of the frequency, sends a power generation limiting instruction such as a generator trip, etc., to each of the electric power stations 17, and also sends a load shedding or system separation instruction to each of the electric power substations 18, whereby the protective relays 21 are operated to protect the electric power system 1 in accordance with these instructions.

Such an electric power system protection control system can enable the electric power system to operate in a stable manner, thus making it possible to prevent a large-scale power failure.

Embodiment 3

Figure 14:
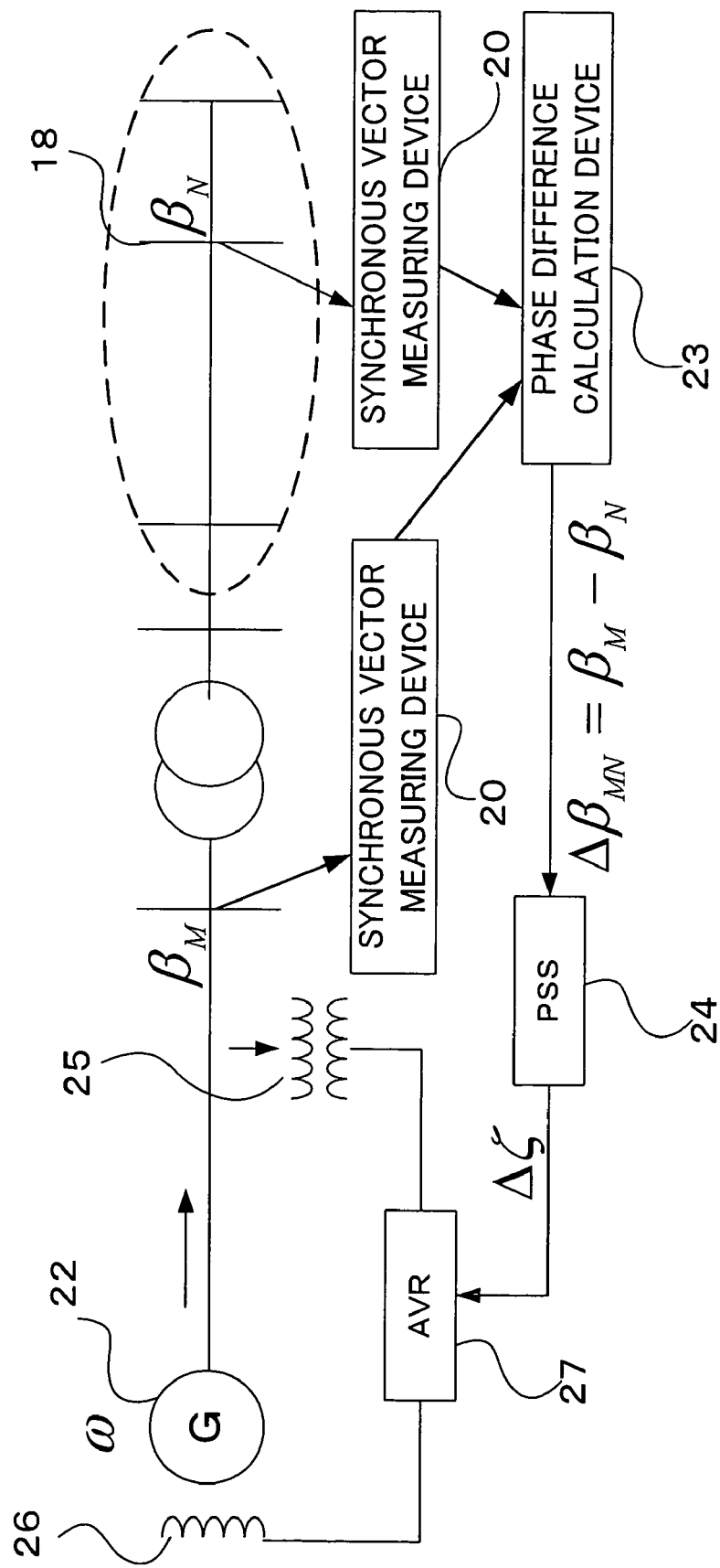
FIG. 14 is a block diagram of a power system long-period oscillation control apparatus using a synchronous vector measuring device according to a third embodiment of the present invention.

FIG. 14 is a block diagram of a power system long-period oscillation control apparatus provided with a synchronous vector measuring device according to a third embodiment of the present invention.

The power system long-period oscillation control apparatus includes a first synchronous vector measuring device 20 for measuring a synchronous vector at an own end of a generator 22, a second synchronous vector measuring device 20 for measuring a synchronous vector of a electric power substation 18 arranged at a location remote from the generator 22, a phase difference calculation device 23 for calculating a phase difference from the absolute phase angles from the respective synchronous vector measuring devices 20, a power system stabilizer 24 for attenuating long-period oscillations of an electric power system, and an automatic voltage regulator 27 for controlling an excitation circuit 26 of the generator 22 with the use of the phase angle and the terminal voltage of the generator 22 measured by a transformer 25 connected to an output side of the generator 22.

The operation of this power system long-period oscillation control apparatus will be described below. Each of the synchronous vector measuring devices 20 arranged at the own end of the generator 22 and at the electric power substation 18, respectively, is similar to that of the first embodiment, and hence an explanation thereof is omitted.

An absolute phase angle $\beta_N$ at the own end of the generator 22 and an absolute phase angle $\beta_M$ at the electric power substation 18 arranged at a remote location therefrom are measured by the first and second vector measuring devices 20, respectively, and a phase difference $\Delta\beta_{MN}$ between these absolute phase angles $\beta_M$ and $\beta_N$, which are synchronized in time with each other by means of GPS, at the same time point is calculated by the phase difference calculation device 23. The phase difference $\Delta\beta_{MN}$ thus calculated is then input to the power system stabilizer 24 where a signal $\Delta\zeta$ for control of the automatic voltage regulator 27 is calculated based on the phase difference $\Delta\beta_{MN}$. In the automatic voltage regulator 27, the voltage of a transmission line is detected by the transformer 25, so that the excitation current of the excitation circuit 26 is controlled based on the voltage thus detected and the control signal $\Delta\zeta$ supplied thereto. In this manner, the generation power of the generator 22 is controlled when there takes place a long-period oscillation in the electric power system.

Such an electric power system long-period oscillation control apparatus can reduce long-period oscillations generated in the electric power system more effectively than in the prior art case where the change rate of effective electric power or the change rate of frequency is used for control in the power system stabilizer 24.

Embodiment 4

Figure 15:
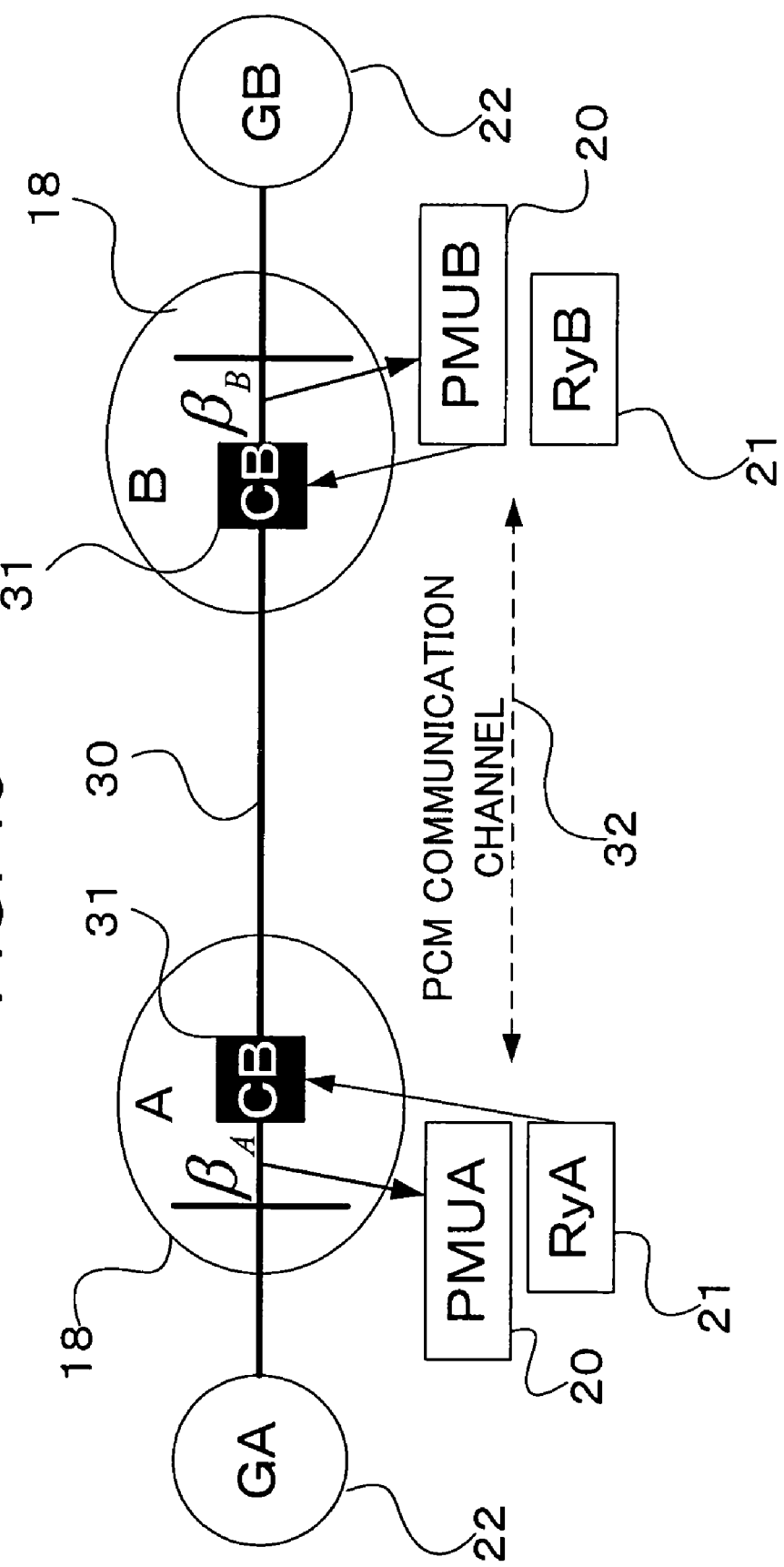
FIG. 15 is a block diagram of an electric power system step-out detection relay protection apparatus using a synchronous vector measuring device according to a fourth embodiment of the present invention.

FIG. 15 is a block diagram of an electric power system step-out detection relay protection apparatus provided with a synchronous vector measuring device according to a fourth embodiment of the present invention.

This electric power system step-out detection relay protection apparatus includes a first and a second synchronous vector measuring device (PMUA, PMUB) 20, a first and a second protective relay (RyA, RyB) 21, and a first and a second circuit breaker (CB, CB) 31 which are respectively provided at a first electric power substation A18 and a second electric power substation B18 arranged at opposite ends of a transmission line 30. A first generator (GA) 22 is connected to the first electric power substation (A) 18, and a second generator (GB) 22 is connected to the second electric power substation (B) 18.

Next, reference will be made to a procedure for determining whether the electric power system is in a step-out state, and for tripping the circuit breakers 31. One of the first and second protective relays 21 transmits an absolute phase difference $\beta_A$ or $\beta_B$ measured by the first or second synchronous vector measuring device 20 to the other or opposite protective relay 21 through a PCM communication channel 32. In each protective relay 21, a phase difference $\Delta\beta_{AB}$ ($=\beta_A-\beta_B$) between the absolute phase differences $\beta_A$ and $\beta_B$ is calculated. When the phase difference $\Delta\beta_{AB}$ thus obtained exceeds a prescribed threshold $\beta_{TH}$, it is determined that the electric power system is in a step-out state, and the first and second protective relays 21 trip the first and second circuit breakers 31, respectively.

In such an electric power system step-out detection relay protection apparatus, the absolute phase angles of synchronous vectors can be measured with high accuracy, at high speed and with high stability. Therefore, it is possible to detect a step-out by adopting a new principle of operation of detecting the step-out from a phase difference between the absolute phase angles.

Usually, the electric power system has hundreds or thousands of lines. Therefore, because the electric power system step-out detection relay protection apparatus of this invention separates the line where set out is detected earliest, it is possible to prevent the whole system from lapsing into a set out, thus improving the stability of the electric power system.

While the invention has been described in terms of preferred embodiments, those skilled in the art will recognize that the invention can be practiced with modifications within the spirit and scope of the appended claims.

What is claimed is:

1. A synchronous vector measuring device comprising:
   a voltage measuring part that measures the voltage of an electric power system in a period equal to ¼N (N being a positive integer) of one period of a reference wave;
   a voltage root-mean-square value calculation part that calculates, at each of timings at which said voltage is measured, a voltage root-mean-square value at a specific timing from said voltages measured at past 4N timings including said specific timing; and
   an absolute phase angle calculation part that calculates an absolute phase angle of a synchronous vector at each of said timings according to the following expression $$\beta = \cos^{-1}\left\{\frac{v_{re}}{\sqrt{2}\,V}\right\}$$

(where $\beta$ is the absolute phase angle, $v_{re}$ is the voltage measured at the specific timing, and $V$ is the voltage root-mean-square value calculated at the specific timing).

2. A synchronous vector measuring device comprising:
   a voltage measuring part that measures the voltage of an electric power system in a period equal to ¼N (N being a positive integer) of one period of a reference wave;
   a voltage root-mean-square value calculation part that calculates, at each of timings at which said voltage is measured, a voltage root-mean-square value at a specific timing from said voltages measured at past 4N timings including said specific timing;

a voltage root-mean-square value averaging part that makes, at each of said timings, an average value between one of said voltage root-mean-square values calculated at said specific timing and at least another one of said voltage root-mean-square values calculated at at least one timing preceding said specific timing to be as a voltage root-mean-square value average value at said specific timing; and an absolute phase angle calculation part that calculates an absolute phase angle of a synchronous vector at each of said timings according to the following expression $$\beta = \cos^{-1}\left\{\frac{v_{re}}{\sqrt{2}\,V_{ave}}\right\}$$

(where $\beta$ is the absolute phase angle, $v_{re}$ is the voltage measured at the specific timing, and $V_{ave}$ is the voltage root-mean-square value average value calculated at the specific timing).

3. A synchronous vector measuring device comprising:

a voltage measuring part that measures the voltage of an electric power system in a period equal to ¼N (N being a positive integer) of one period of a reference wave;

a voltage root-mean-square value calculation part that calculates, at each of timings at which said voltage is measured, a voltage root-mean-square value at a specific timing from said voltages measured at past 4N timings including said specific timing;

a voltage root-mean-square value averaging part that makes, at each of said timings, an average value between one of said voltage root-mean-square values calculated at said specific timing and at least another one of said voltage root-mean-square values calculated at at least one timing preceding said specific timing to be as a voltage root-mean-square value average value at said specific timing;

a chord length calculation part that calculates, at each of said timings, a voltage rotating vector directed to a point represented by a complex number on a complex plane consisting of a real part which is one of said voltages measured at said specific timing, and an imaginary part which is one of said voltages measured at a timing delayed by 90 electrical degrees from said specific timing, and further calculates the length of a cord connecting between a tip end of one of said voltage rotating vectors calculated at said specific timing and a tip end of another one of said voltage rotating vectors calculated at a timing immediately preceding said specific timing;

a rotational phase angle calculation part that adds, at each of said timings, said chord lengths calculated at the past 4N timings including said specific timing, and calculates, based on a total sum of said cord lengths and said voltage root-mean-square value average value, a phase angle between one of said voltage rotating vectors calculated at said specific timing and another one of said voltage rotating vectors calculated at a timing preceding said specific timing by one period of said reference wave;

a frequency calculation part that calculates, at each of said timings, the frequency of said electric power system from said phase angle thus calculated;

a voltage instantaneous value estimating part that calculates, at each of said timings, an angular velocity of a voltage rotating vector from said frequency calculated at said specific timing, and expands each of said voltages measured at the past 4N timings including said specific timing according to the following expression $$v_{re} = P_1 \cos \omega t + P_2 \sin \omega t$$

(where $v_{re}$ is each of the voltages measured at the past 4N timings including the specific timing, $\omega$ is the angular velocity of a voltage rotating vector obtained at the specific timing, and $P_1$ and $P_2$ are coefficients at the specific timing), calculates coefficient estimated values at said specific timing from said coefficients at the past 4N timings including said specific timing by using a least square method, and estimates a voltage real number instantaneous estimated value at said specific timing from said coefficient estimated values according to the following expression $$v_{re\_est} = P_{1est} \cos \omega t + P_{2est} \sin \omega t$$

(where $v_{re\_est}$ is the voltage real number instantaneous estimated value estimated at said specific timing, and $P_{1est}$ and $P_{2est}$ are the coefficient estimated values estimated at said specific timing); and a absolute phase angle calculation part that calculates an absolute phase angle of the synchronous vector at each of said timings according to the following expression $$\beta = \cos^{-1}\left\{\frac{v_{re\_est}}{\sqrt{2}\,V_{ave}}\right\}$$

(where $\beta$ is the absolute phase angle, $v_{re\_est}$ is the voltage real number instantaneous estimated value estimated at said specific timing, and $V_{ave}$ is the voltage root-mean-square value average value calculated at said specific timing).

4. The synchronous vector measuring device as set forth in any of claims 1 through 3, wherein said synchronous vector measuring device is provided at either one of an electric power system stabilization protection apparatus, an electric power system long-period oscillation control apparatus, and an electric power system step-out detection relay protection apparatus.

* * * * *